United States Patent
Kraus et al.

(10) Patent No.: US 8,344,267 B2
(45) Date of Patent: Jan. 1, 2013

(54) LED LUMINOUS MODULE WITH CROSSOVER CONNECTING ELEMENT

(75) Inventors: Robert Kraus, Regensburg (DE); Simon Schwalenberg, Regensburg (DE); Steffen Strauβ, Regensburg (DE); Michael Weis, München (DE)

(73) Assignee: OsramGesellschaft mit beschraenkter Haftung, Munich (DE)

( * ) Notice: Subject to any disclaimer, the term of this patent is extended or adjusted under 35 U.S.C. 154(b) by 798 days.

(21) Appl. No.: 12/230,361

(22) Filed: Aug. 28, 2008

(65) Prior Publication Data

US 2009/0057000 A1 Mar. 5, 2009

(30) Foreign Application Priority Data

Aug. 29, 2007 (DE) .................. 10 2007 040 871

(51) Int. Cl.
  *H05K 1/11* (2006.01)
  *F21S 4/00* (2006.01)
  *F21V 21/00* (2006.01)
(52) U.S. Cl. .................. 174/262; 362/249.02
(58) Field of Classification Search .................. 174/262
  See application file for complete search history.

(56) References Cited

U.S. PATENT DOCUMENTS

| | | | | |
|---|---|---|---|---|
| 3,539,705 A | * | 11/1970 | Davis, Jr. et al. | 174/254 |
| 3,615,949 A | * | 10/1971 | Hicks | 216/15 |
| 3,801,388 A | * | 4/1974 | Akiyama et al. | 216/20 |
| 4,288,840 A | | 9/1981 | Konishikawa et al. | |
| 5,357,051 A | * | 10/1994 | Hwang | 174/33 |
| 5,701,234 A | * | 12/1997 | Wong | 361/773 |
| 5,907,265 A | * | 5/1999 | Sakuragawa et al. | 333/1 |
| 6,246,107 B1 | * | 6/2001 | Silvestre | 257/666 |
| 6,271,481 B1 | * | 8/2001 | Goenka et al. | 174/261 |
| 6,395,994 B1 | * | 5/2002 | Goenka et al. | 174/255 |
| 6,636,653 B2 | * | 10/2003 | Miracky et al. | 385/14 |
| 6,744,223 B2 | | 6/2004 | Laflamme et al. | |
| 6,851,831 B2 | * | 2/2005 | Karlicek, Jr. | 362/249.06 |
| 6,949,819 B2 | * | 9/2005 | Saito et al. | 257/692 |
| 7,473,851 B2 | * | 1/2009 | Dunand et al. | 174/254 |
| 2002/0007967 A1 | | 1/2002 | Yamanashi et al. | |
| 2002/0108775 A1 | * | 8/2002 | Foster, Sr. | 174/250 |
| 2003/0116773 A1 | * | 6/2003 | Kraus et al. | 257/88 |
| 2006/0202338 A1 | * | 9/2006 | Strasser | 257/758 |
| 2006/0226336 A1 | * | 10/2006 | York et al. | 250/206 |
| 2008/0049445 A1 | * | 2/2008 | Harbers et al. | 362/612 |
| 2008/0111471 A1 | * | 5/2008 | Blumel et al. | 313/502 |
| 2009/0283780 A1 | * | 11/2009 | Ansems et al. | 257/89 |

FOREIGN PATENT DOCUMENTS

| | | |
|---|---|---|
| DE | 1 261 916 A | 2/1968 |
| DE | 29 38 712 | 4/1980 |
| WO | 2006/099732 A1 | 9/2006 |

* cited by examiner

*Primary Examiner* — Timothy Thompson
*Assistant Examiner* — Nathan Milakovich

(57) ABSTRACT

Connecting element for mounting on a printed circuit board, which connecting element has at least two connecting lines which cross one another and are not electrically connected between respectively associated contacts.

11 Claims, 4 Drawing Sheets

LED LUMINOUS MODULE WITH CROSSOVER CONNECTING ELEMENT

The invention relates to a connecting element for mounting on a printed circuit board, a printed circuit board comprising at least one connecting element, and an LED module comprising a printed circuit board.

On account of the high thermal power losses, light emitting diodes or LEDs in high-power LED modules are mounted as near as possible to the heat sink. It is important in this case that the thermal resistance of the chips with respect to the heat sink is kept low by the fewest possible interlayers. On the other hand, in order to realize the necessary wiring between the LEDs and between LEDs and possible electrical components, multilayer substrates are often required, which is generally associated with a deterioration in thermal contact and with additional production costs.

Electrically isolated crossover points of two lines have previously been realized by 0Ω resistors that function as a bridge over a conductor track. Alternatively, e.g. a series circuit is realized on an external multilayer circuit board.

The object of the invention is to provide a simpler and simpler-to-construct possibility for the electrically crossing connection of elements of a printed circuit board.

This object is achieved by means of an LED luminous module according to claim 1. Advantageous configurations can be gathered in particular from the dependent claims.

The LED luminous module comprises at least one printed circuit board with at least one connecting element fitted thereon.

The connecting element for mounting on a printed circuit board comprises at least two connecting lines which cross one another and are not electrically connected between respectively associated contacts. It is thereby possible to provide in particular more than two line crossovers by means of a simply mountable component on integral circuit boards.

The connecting element is electrically connected to at least one of the LEDs.

The device is suitable in particular for LED modules having a high color rendering index which require a full light spectrum. On account of the narrowband emission of the LEDs, three or more different-colored LEDs are typically combined in a luminaire. High luminous flux requirements necessitate the use of a plurality of these individual colors. In order to achieve a good intermixing of the individual colors, the LEDs are advantageously arranged radially symmetrically about the optical axis. For color control/regulation, the individual colors can be operated with different powers, e.g. by means of pulse width control. On account of the electrical properties of light emitting diodes, a series circuit of the LEDs of one color is preferred. This gives rise to a crossover point of three or more conductor tracks in the center of the luminous module, which crossover point cannot be realized by means of a monolayer circuit board without a high manufacturing outlay, but can be realized in a simple manner by means of the above connecting element.

The connecting element is preferably constructed in multilayer fashion, in particular using circuit board construction techniques. The connecting lines can thus be distributed between the different layers in a simple manner, by way of example.

In one preferred variant, the connecting element is designed to be connected to the printed circuit board by means of wire bonding. For this purpose, the connecting element may comprise bonding pads at its top side, for example, which serve as contacts to the connecting lines.

In an alternative preferred variant, the connecting element is designed to be connected to the printed circuit board by means of flip-chip bonding. For this purpose, the connecting element may comprise bonding pads at its underside, for example, which serve as contacts to the connecting lines.

It is also possible to use hybrid connecting elements comprising wire bonding and flip-chip variants.

For electrically connecting more than two elements, in particular LEDs, in the connecting element preferably at least one connecting line is embodied as an electrical branching mechanism.

The printed circuit board is equipped with a connecting element fitted thereon.

The printed circuit board is preferably embodied in monolayer fashion for improved thermal conductivity.

Preference is given to a printed circuit board in which the connecting element is connected to a plurality of LEDs and is arranged in the region of the optical axis of the combined LEDs.

The LEDs are preferably of different colors, and, in particular grouped as LED clusters, can produce an additively white color mixing. For this purpose, for a high luminous intensity, LED clusters are preferably composed of the individual colors RGB, RGGB, RRGB, RRGGB, etc., preferably with a plurality of LEDs per color. Specifically, in order to achieve a good intermixing of the individual colors, the connecting element is preferably arranged in the center of the LEDs, which are preferably arranged radially symmetrically about the center. For the color control of the LED, the connecting element is preferably additionally equipped with an optical sensor on the optical axis for the color control of the LEDs, which sensor is equipped with or connected to corresponding control electronics.

Preference is furthermore given to an LED luminous module in which the connecting element is connected to a plurality of LEDs, wherein LEDs of identical type are electrically connected to one another by the connecting element.

Preference is also given to an LED luminous module in which LEDs of identical type correspond to LEDs of identical color.

In the following figures, the invention is schematically illustrated in more detail on the basis of exemplary embodiments that should not be understood restrictively. Identical or identically acting elements may be illustrated with identical reference symbols across a plurality of figures.

Figure 1:
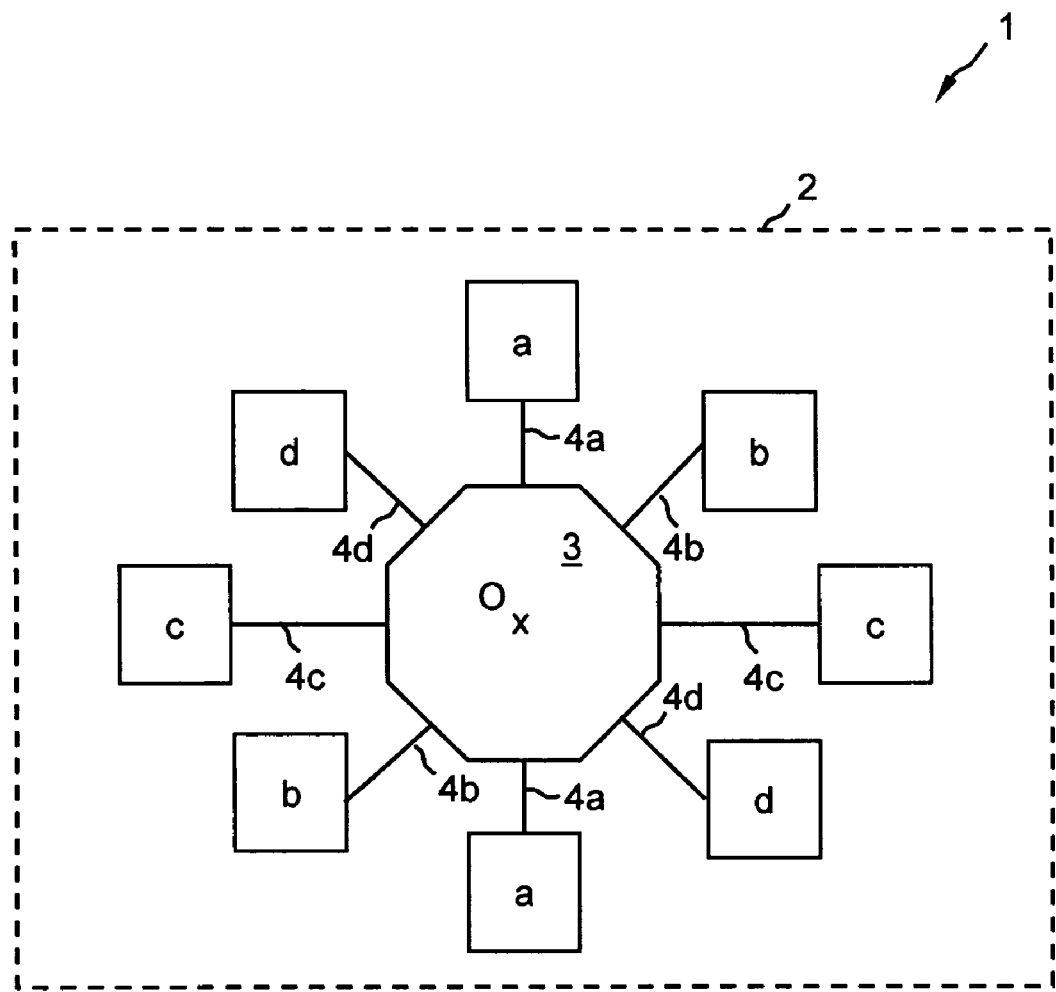
FIG. 1 shows in plan view a printed circuit board populated with a connecting element in accordance with a first embodiment.

FIG. 1 shows an LED module 1 comprising a monolayer circuit board 2, and mounted thereon an array of essentially radially symmetrically arranged LEDs a-d ("LED clusters"). LEDs situated opposite one another which are designated by the same reference symbols, are electrically connected to one another e.g. in series. An optical axis O of the LED luminous module 1 arises during operation of the LEDs a-d.

In the region of the optical axis O, i.e. the center of the LEDs a-d, a connecting element 3 is furthermore mounted on the circuit board 2. The correspondingly associated LEDs a-d are electrically connected to one another by the connecting element 3. Specifically, for this purpose the LEDs a-d are connected via connection lines 4a-4d to suitable contacts (not illustrated) of the connecting element 3. The connecting element 3 is constructed in such a way that it has connecting lines which cross one another and are not electrically connected and which respectively connect the associated LEDs a-a, b-b, c-c, d-d to one another. Associated LEDs a-a, b-b, c-c, d-d may be in particular LEDs of identical color, such as LEDs emitting red, green, blue, amber or white light. This arrangement has the advantage that, firstly, expensive multilayer circuit boards are not required, and, secondly, line bridges no longer have to be applied in a complicated manner. The connecting element 3 can be prefabricated and then placed onto the circuit board 2 in a simple manner.

The arrangement shown enables a plurality of components to be arranged in a very confined space, which components can be connected in series in each case via a central crossover. This gives rise to good optical properties as a result of the spatial intermixing of the colors; good thermal properties as a result of the uniform arrangement of the LEDs; good electrical conditions as a result of the common driving of the respective LED color clusters; and small structural spaces, whereby the usually expensive carrier material is minimized.

Figure 2:
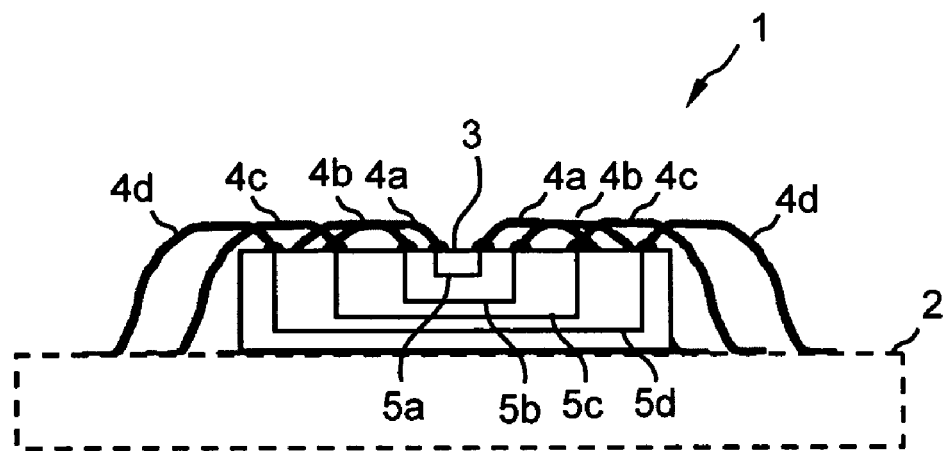
FIG. 2 shows as a cross-sectional illustration in side view a printed circuit board populated with the connecting element according to FIG. 1.

FIG. 2 shows a more detailed excerpt from the LED module 1 as a cross section through the connecting element 3. The connecting element 3 is applied on the circuit board 2 in such a way that the bondable contacts (not illustrated) are arranged on the top side. The connection lines 4a-4d are embodied in the form of bonding wires which connect to the contacts. The connecting element 3 shown is constructed in multilayer fashion, wherein a connecting wire 5a-5d is led horizontally in each layer. The electrical connection between the respective contacts and the associated horizontal parts of the connecting wires 5a-5d is realized here via plated-through holes. The connecting wires 5a-5d are arranged in a manner angled with respect to one another in plan view and lie approximately along the connecting lines between the LEDs a, b, c and d to be connected.

Figure 3:
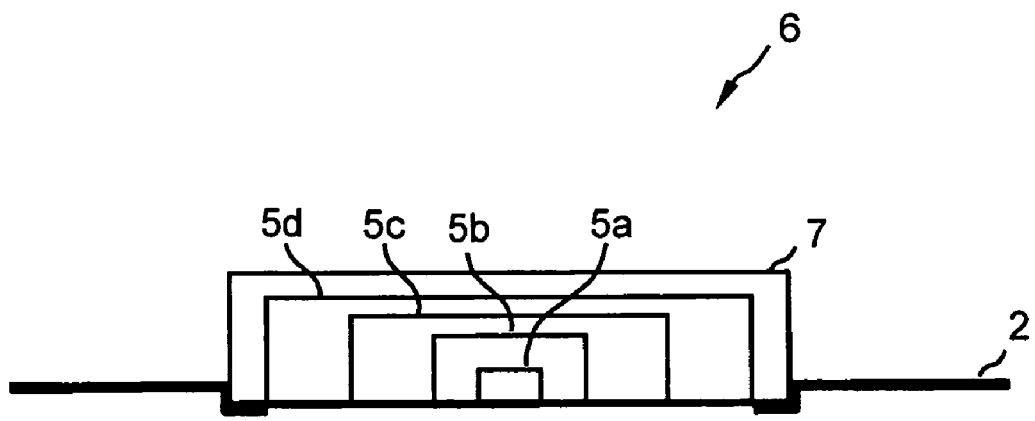
FIG. 3 shows as a cross-sectional illustration in side view a printed circuit board populated with a connecting element in accordance with a further embodiment.

FIG. 3 shows a further LED module 6 in an illustration analogous to FIG. 2, in which module the connecting element 7, having a construction identical in principle to the connecting element 3 from FIG. 2, is now fitted with the contacts directed toward the circuit board 2 using flip-chip technology on the circuit board 2, specifically with soldering or adhesive contacts on the underside.

Figure 4:
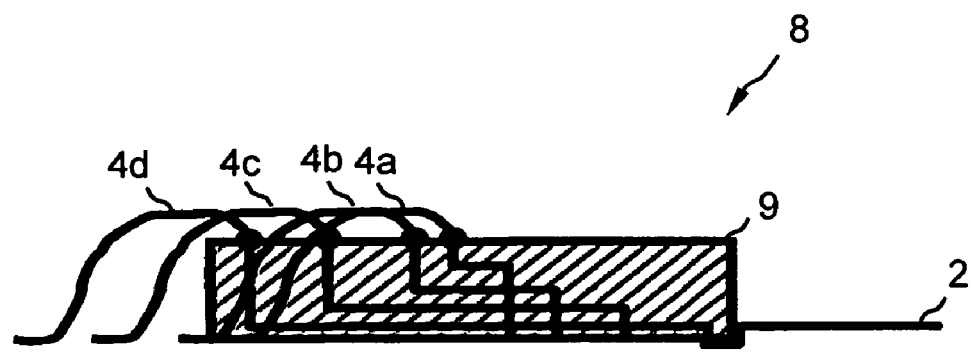
FIG. 4 shows as a cross-sectional illustration in side view a printed circuit board populated with a connecting element in accordance with yet another embodiment.

FIG. 4 shows a further LED module 8 in an illustration analogous to FIG. 2, in which module the connecting element 9 now has a hybrid configuration suitable for connection by means of a combination of flip-chip technology and wire bonding technology. For this purpose, the connecting lines are led in the connecting element 9 on one side to be contact-connected to the other side to be contact-connected.

Figure 5:
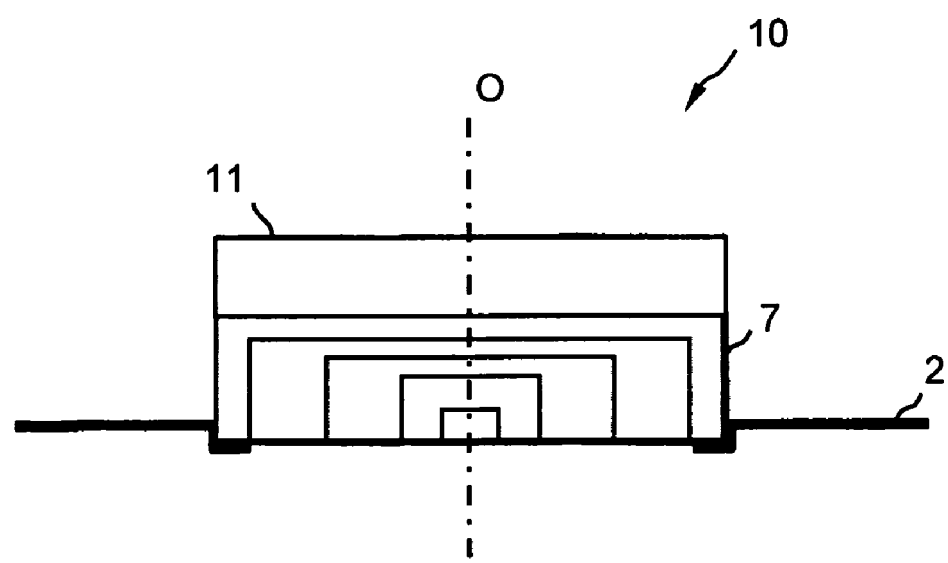
FIG. 5 shows as a cross-sectional illustration in side view a printed circuit board populated with a connecting element in accordance with yet another embodiment.

FIG. 5 shows an LED module 10 with a flip-chip-mounted connecting element 7 similar to that from FIG. 3, wherein an optical sensor 11 is now provided on the top side opposite to the contacts. Since the connecting element 7, 11 is situated on the optical axis O, the property of the light incident in the optical sensor 11 corresponds to that of the light emitted by the LED module 10. A color control of the module 10 can thereby be carried out particularly precisely by means of the optical sensor 11. For this purpose, the sensor 11 is connected to a corresponding control circuit (not illustrated).

Figure 6:
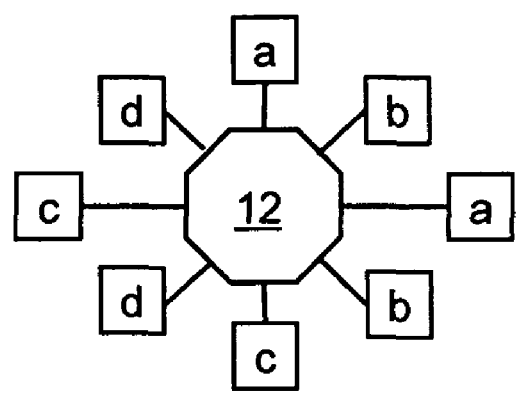
FIG. 6 shows in plan view a printed circuit board populated with a connecting element in accordance with a further embodiment.

FIG. 6 shows a connecting element 12 and LEDs a-d in an illustration simplified with respect to FIG. 1. The illustration shows that the connecting lines or crossovers do not have to only connect opposite contacts or LEDs a-d, but rather can electrically connect any desired positions (contacts or LEDs a-d). In this case, the wiring layout of the circuit board 2 does not have to be altered in comparison with FIG. 1, which allows a simpler reconfiguration of the LED module.

Figure 7:
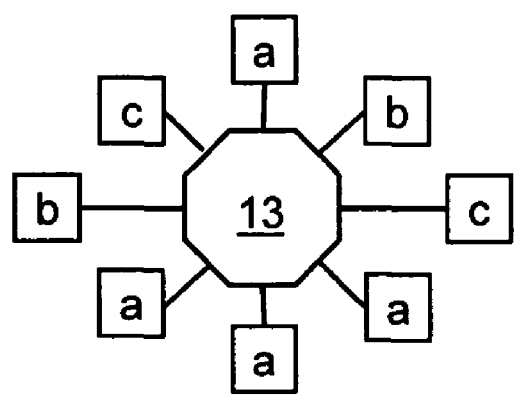
FIG. 7 shows in plan view a printed circuit board populated with a connecting element in accordance with yet another embodiment.

FIG. 7 shows an arrangement of a connecting element 13 and LEDs a-c analogously to FIG. 6, wherein the connecting element 13 now has connecting lines which are configured both as simple connecting lines or crossovers and as branching mechanisms. In this embodiment it is thereby possible for four LEDs a to be electrically connected to one another, and also in each case two LED pairs a-a and b-b. Here, too, the wiring layout of the circuit board 2 does not have to be altered in comparison with FIG. 1 or FIG. 6, which allows a simpler reconfiguration of the LED module.

It goes without saying that the present invention is not restricted to the exemplary embodiments shown. Thus, the number of components connected to the connecting element can be different with respect thereto. Moreover, the type of elements connected can differ and may comprise circuit elements such as drivers or control circuits for example in addition or as an alternative to LEDs. Possible substrates for the connecting component are e.g. multilayer printed circuit materials such as FR4 or silicon components.

List of Reference Symbols
1 LED module
2 Circuit board
3 Connecting element
4 Connection lines
5 Connecting lines
6 LED module
7 Connecting element
8 LED module
9 Connecting element
10 LED module
11 Optical sensor
12 Connecting element
13 Connecting element
a LED
b LED
c LED
d LED
o Optical axis

The invention claimed is:

1. An LED luminous module comprising at least one printed circuit board with at least one connecting element and at least three non-collinear LEDs fitted thereon, wherein the connecting element has at least two connecting lines which cross one another and are not electrically connected between respectively associated contacts, and wherein the connecting element is connected to the at least three non-collinear LEDs and is arranged in the region of the optical axis of the at least three non-collinear LEDs.

2. The LED luminous module as claimed in claim 1, wherein the connecting element is constructed in multilayer fashion.

3. The LED luminous module as claimed in claim 1, wherein the connecting element is designed to be connected to the printed circuit board by means of wire bonding.

4. The LED luminous module as claimed in claim 1, wherein the connecting element is designed to be connected to the printed circuit board by means of flip-chip bonding.

5. The LED luminous module as claimed in claim 1, wherein the connecting element is designed to be connected to the printed circuit board partly by means of flip-chip bonding and partly by means of wire bonding.

6. The LED luminous module as claimed in claim 1, wherein at least one connecting line is embodied as an electrical branching mechanism.

7. The LED luminous module as claimed in claim 1, wherein the printed circuit board is embodied in monolayer fashion.

8. The LED luminous module as claimed in claim 1, wherein the connecting element is arranged in the center of the LEDs.

9. The LED luminous module as claimed in claim 1, wherein the LEDs are of identical type.

10. The LED luminous module as claimed in claim 9, wherein the LEDs are of identical color.

11. The LED luminous module as claimed in claim 1, wherein the connecting element additionally comprises an optical sensor on the optical axis for the color control of the LEDs.

\* \* \* \* \*